US009214793B2

(12) United States Patent
Shiraki (10) Patent No.: US 9,214,793 B2
(45) Date of Patent: Dec. 15, 2015

(54) ELECTRICAL CONNECTION BOX (71) Applicant: SUMITOMO WIRING SYSTEMS, LTD., Yokkaichi, Mie (JP)

(72) Inventor: Takashi Shiraki, Yokkaichi (JP)

(73) Assignee: SUMITOMO WIRING SYSTEMS, LTD., Mie (JP)

(*) Notice: Subject to any disclaimer, the term of this patent is extended or adjusted under 35 U.S.C. 154(b) by 0 days.

(21) Appl. No.: 14/504,871

(22) Filed: Oct. 2, 2014

(65) Prior Publication Data

US 2015/0101862 A1 Apr. 16, 2015

(30) Foreign Application Priority Data

Oct. 11, 2013 (JP) ................................. 2013-214087

(51) Int. Cl.
| | |
|---|---|
| H05K 5/06 | (2006.01) |
| H02G 3/14 | (2006.01) |
| H05K 5/00 | (2006.01) |
| H02G 3/08 | (2006.01) |

(52) U.S. Cl.
CPC ................. *H02G 3/14* (2013.01); *H02G 3/088* (2013.01); *H05K 5/0013* (2013.01)

(58) Field of Classification Search
CPC .................................................... H05K 5/0013
USPC ......................................................... 174/563
See application file for complete search history.

(56) References Cited

U.S. PATENT DOCUMENTS

| | | | | | |
|---|---|---|---|---|---|
| 6,112,934 | A | * | 9/2000 | Jung et al. | 220/315 |
| 8,097,818 | B2 | * | 1/2012 | Gerull et al. | 174/564 |
| 8,881,923 | B2 | * | 11/2014 | Higginson | 220/3.8 |
| 2002/0136586 | A1 | * | 9/2002 | Ansell et al. | 400/691 |
| 2004/0101356 | A1 | * | 5/2004 | Cheng | 403/353 |
| 2007/0103850 | A1 | * | 5/2007 | Melman et al. | 361/679 |
| 2009/0168311 | A1 | * | 7/2009 | Hung | 361/679.01 |
| 2010/0270305 | A1 | * | 10/2010 | Yamamoto et al. | 220/315 |
| 2011/0239418 | A1 | * | 10/2011 | Huang | 24/592.11 |
| 2012/0027511 | A1 | * | 2/2012 | Wei et al. | 403/381 |
| 2012/0187812 | A1 | * | 7/2012 | Gerst | 312/237 |
| 2013/0010413 | A1 | * | 1/2013 | Kim et al. | 361/679.01 |
| 2014/0016996 | A1 | * | 1/2014 | Chung et al. | 403/321 |

FOREIGN PATENT DOCUMENTS

JP    A-2008-092766    4/2008

* cited by examiner

*Primary Examiner* — Hung V Ngo
(74) *Attorney, Agent, or Firm* — Oliff PLC (57) ABSTRACT

An electrical connection box assembled by a lock structure has a first case, a second case, a plurality of lock pieces, an engagement protrusion, a plurality of lock recesses, and an engagement part. The plurality of lock pieces are provided to a peripheral wall of the first case and are elastically deformable toward an inner side of the first case. The engagement protrusion is provided to an outer surface of each lock piece. The plurality of lock recesses are provided to a peripheral wall of the second case. The engagement part is provided bridging each lock recess, the lock pieces being disposed between the lock recesses and the engagement parts, the engagement protrusions engaging the engagement parts to assemble the first and second cases, engagement between the engagement protrusions and the engagement parts being released by deformation of the lock pieces inside the lock recesses.

13 Claims, 8 Drawing Sheets

ELECTRICAL CONNECTION BOX

BACKGROUND

This application claims priority to JP 2013-214087 filed in Japan on Oct. 11, 2013, the entire disclosure of which is hereby incorporated by reference in its entirety.

The present invention relates to an electrical connection box that mounts to a vehicle or the like, and in particular relates to an electrical connection box in which a first case and a second case are assembled by a lock structure as opening parts of each of the first case and a second case are mated together.

Conventionally, in a vehicle or the like, an electrical connection box such as a junction box or a relay box is used. For example, such structure is disclosed in Japanese Patent Application Publication No. 2008-92766. With the electrical connection box disclosed in Japanese Patent Application Publication No. 2008-92766, a lower cover as a first case and a main body case as a second case are assembled to each other by mating the opening parts of each.

A first case and a second case, like a lower cover and a main body case of an electrical connection box, are assembled to each other using a lock structure. Conventionally, as also disclosed in Japanese Patent Application Publication No. 2008-92766, a form widely used for this kind of lock structure has been a lock frame in the form of a frame extending at an outer surface of a peripheral wall of the first case, the lock frame engaging a latch protrusion extending at an outer surface of a peripheral wall of the second case.

However, with the electrical connection box as disclosed in Japanese Patent Application Publication No. 2008-92766, when assembling the second case to the first case, before locking the lock structure it was necessary to first mate the opening parts of each across an entire periphery. Accordingly, the assembly required time and labor.

On the other hand, with the first case and the second case in an assembled state, the lock structure would close over a peripheral wall of the second case between the lock frame and a peripheral wall of the first case, and would lock with the lock frame covering a peripheral wall of the second case from an outer surface. Therefore, releasing the lock was problematic in that it was necessary to expand the lock frame outward, but due to there being nearly no space between the lock frame and the peripheral wall of the second case, a tool or the like was needed to pry open the lock frame, and releasing the lock therefore required time and labor.

SUMMARY

The present invention was made in view of circumstances such as those discussed above and has as an object providing an electrical connection box with a new structure facilitating easier assembly and release between a first case and a second case of the electrical connection box assembled by a lock structure after opening parts of each of the first case and the second case are mated together.

A first illustrative embodiment is an electrical connection box assembled by a lock structure, the electrical connection box comprising a first case, a second case, a plurality of lock pieces, an engagement protrusion, a plurality of lock recesses, and an engagement part. The first case has a first opening part, and the second case has a second opening part mated to the first opening part of the first case. The plurality of lock pieces are provided to a peripheral wall of the first case, the lock pieces protruding toward the second case further than the first opening part of the first case, the lock pieces each forming a lock structure elastically deformable toward an inner side of the first case. The engagement protrusion is provided to an outer surface of each lock piece. The plurality of lock recesses are provided to a peripheral wall of the second case, the lock recesses opening to an outer surface of the second case and being recessed toward an inner side of the second case, the lock recesses each forming the lock structure in which an end part on a first case side of the second case opens toward the first case. The engagement part is provided at each lock recess on the end part of the first case side, the engagement part bridging the lock recess such that an opening the lock recess toward the outer surface is covered, the lock pieces of the first case being inserted inside the lock recesses from between the lock recesses and the engagement parts of the second case. The engagement protrusions of the lock pieces engage the engagement parts such that the first case and the second case are assembled to each other, engagement between the engagement protrusions and the engagement parts being releasable by deformation of the lock pieces inside the lock recesses toward an inner side of the first case.

With the electrical connection box formed according to the present embodiment, each lock piece of the first case protrudes beyond the first opening part of the first case. Accordingly, when the first case is assembled to the second case, each lock piece of the first case may be inserted between a lock recess and an engagement part of the second case prior to mating the opening parts of each of the first case and the second case. As a result, it is possible to align the opening parts of each case, and the opening parts can be easily mated. In other words, by first aligning a plurality of places on the peripheries of the first case and the second case using the lock structure, it is possible to align the opening parts of each case in a circumferential direction, and the opening parts can be easily mated. In particular, by inserting the lock piece of the first case into an opening formed between the lock recess and the engagement part of the second case, the positioning of the first case and the second case can be ensured.

In addition, the lock piece of the first case may have an engagement protrusion provided at an outer surface which engages the engagement part of the second case on an outer side. Also, a clearance on an inner side of the lock piece may be maintained by the lock recess, and deformation toward the inner side of the lock piece is thereby allowed. Accordingly, engagement with the engagement part can be released by pushing the lock piece from an outer side to an inner side, and the lock can be easily released by hand without the need for a tool or the like.

A second illustrative embodiment is such that each lock piece of the first case of the first illustrative embodiment protrudes from an opening end surface of the peripheral wall of the first case.

According to this illustrative embodiment, by having the lock piece extend continuously from the peripheral wall, with the exception of the engagement protrusion protruding at the outer surface, substantially the entirety of each lock piece may be formed without projecting to the outer side of the first case from the peripheral wall. Accordingly, it is possible to reduce the unevenness on the peripheral wall of the first case, reduce the likelihood of electrical wires and such catching on the peripheral wall, and improve the aesthetic appearance of the electrical connection box. In particular, the concave lock recess may be formed on the second case, and the lock piece may be positioned inside the lock recess such that there is less bulging to the outer side of the second case as well and less irregularity on the surface of the electrical connection box.

A third illustrative embodiment is such that, with the structure of the first or second illustrative embodiment, a guide part may be formed sandwiching each lock piece of the first case on both sides, the guide part protruding at a widthwise outer side of the lock piece and being inserted into the lock recess together with the lock piece.

According to this illustrative embodiment, a guide part may be interposed between the lock recess and both sides of each lock piece in a widthwise direction. Accordingly, when each lock piece is inserted into a lock recess, and when the lock piece deforms during locking and releasing, friction of the lock piece with the lock recess can be avoided, and locking and releasing can be carried out smoothly. Also, with this illustrative embodiment, there is preferably formed on the guide part a taper part which tapers along the entirety of the lock piece and the guide part on both sides of the lock piece. With such an embodiment, the lock piece and the guide part can be more easily inserted between the lock recess and the engagement part.

A fourth illustrative embodiment is such that, with the structure of one of the first to third illustrative embodiments, a spacer part may be formed sandwiching each lock piece of the first case on both sides, the spacer part protruding to the inner side of the first case and being inserted into the lock recess together with the lock piece.

According to this illustrative embodiment, by inserting the spacer part into the lock recess, it is possible to reliably form a clearance for deformation on the inner side of the lock piece, and releasing the lock by pressing the lock piece can be more reliably carried out.

A fifth illustrative embodiment is such that, with the structure of one of the first to fourth illustrative embodiments, protruding front end edge parts of all of the lock pieces provided to the first case may be evenly positioned relative to each other with respect to an insertion direction into the lock recesses.

According to this illustrative embodiment, each of the lock pieces provided at each position on the periphery of the first case can be simultaneously inserted between the lock recesses and the engagement parts of the second case. Accordingly, the first case and the second case can be more easily aligned.

A sixth illustrative embodiment is such that, with the structure of one of the first to fifth illustrative embodiments, a stepped part may be formed in the peripheral wall of the first case at an end part of a side of the first opening part of the first case, the stepped part expanding to an outer side of the first case, the lock piece being provided closer to the first opening part of the first case than the stepped part of the peripheral wall of the first case. Also, a drain hole may be formed penetrating the stepped part.

According to this illustrative embodiment, by forming a stepped part on the peripheral wall of the first case, the formation region of the lock piece can project outward, and space for the lock piece to deform inward can be ensured. Also, by forming a drain hole in the stepped part, the space projecting outward relative to the first case can be efficiently used, and the waterproofing properties of the electrical connection box can be improved. Moreover, this illustrative embodiment is preferably used in conjunction with the second illustrative embodiment. In other words, by forming the opening end surface of the peripheral wall from which the lock piece protrudes so as to project outward, space for the lock piece to deform inwardly can be ensured, and the lock piece can be formed such that the lock piece does not protrude outwardly from the first case.

According to a preferred embodiment, a lock piece may be provided to a first case protruding beyond an opening part, a concave lock recess may be formed on a peripheral wall of a second case into which the lock piece is inserted, and on an outer surface side the lock piece may engage with an engagement part bridging the lock recess. Accordingly, prior to mating the opening parts of the first case and the second case, the lock piece may be inserted into an opening between the lock recess and the engagement part such that the first case and the second case can be aligned and assembly can be carried out by easily mating the opening parts of each. Also, the lock piece may be engaged on its outer surface and is deformable inwardly within the lock recess such that the lock can be easily released without the need for a tool or the like, as the engagement with the engagement part can be released by pushing the lock piece inward by hand.

DETAILED DESCRIPTION OF EMBODIMENTS

Embodiments of the present invention will be explained below with reference to the drawings.

Figure 1:
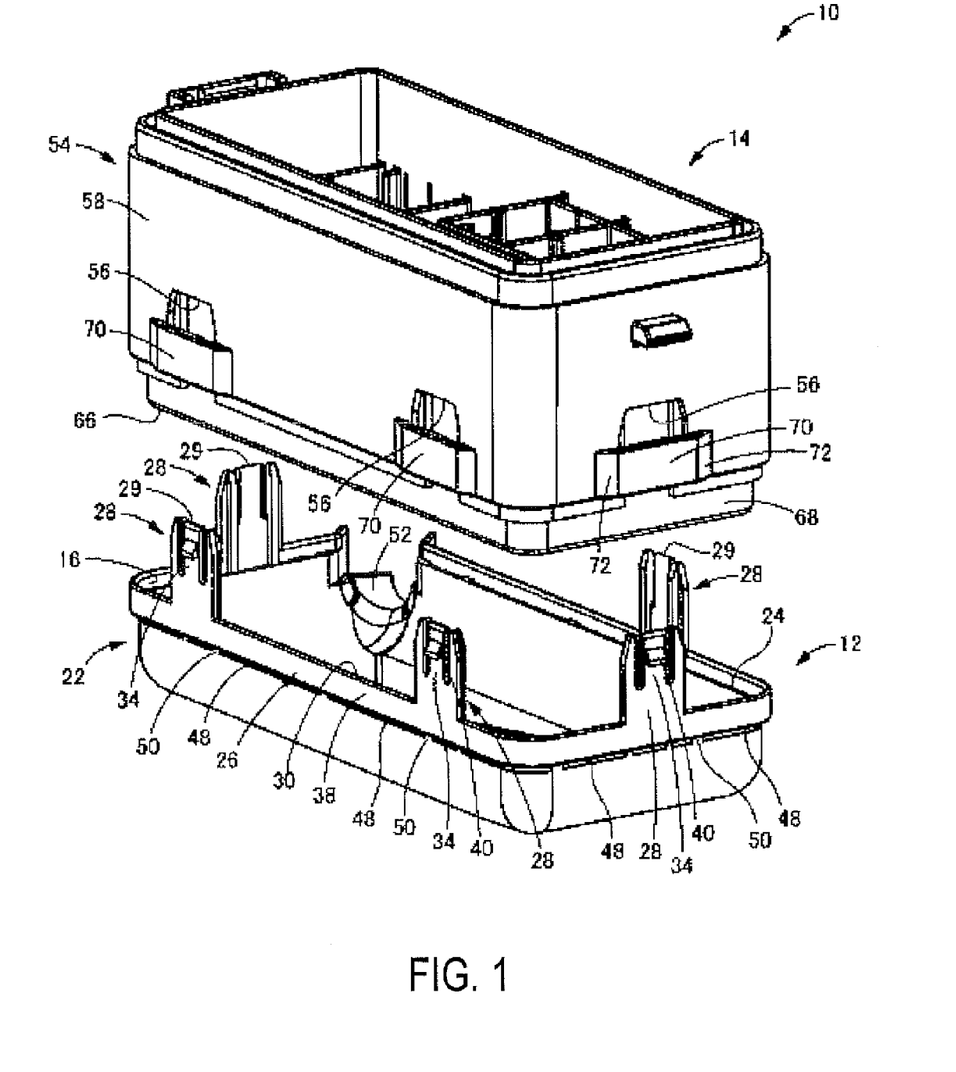
FIG. 1 is an exploded perspective view of an electrical connection box as one embodiment.
Figure 2:
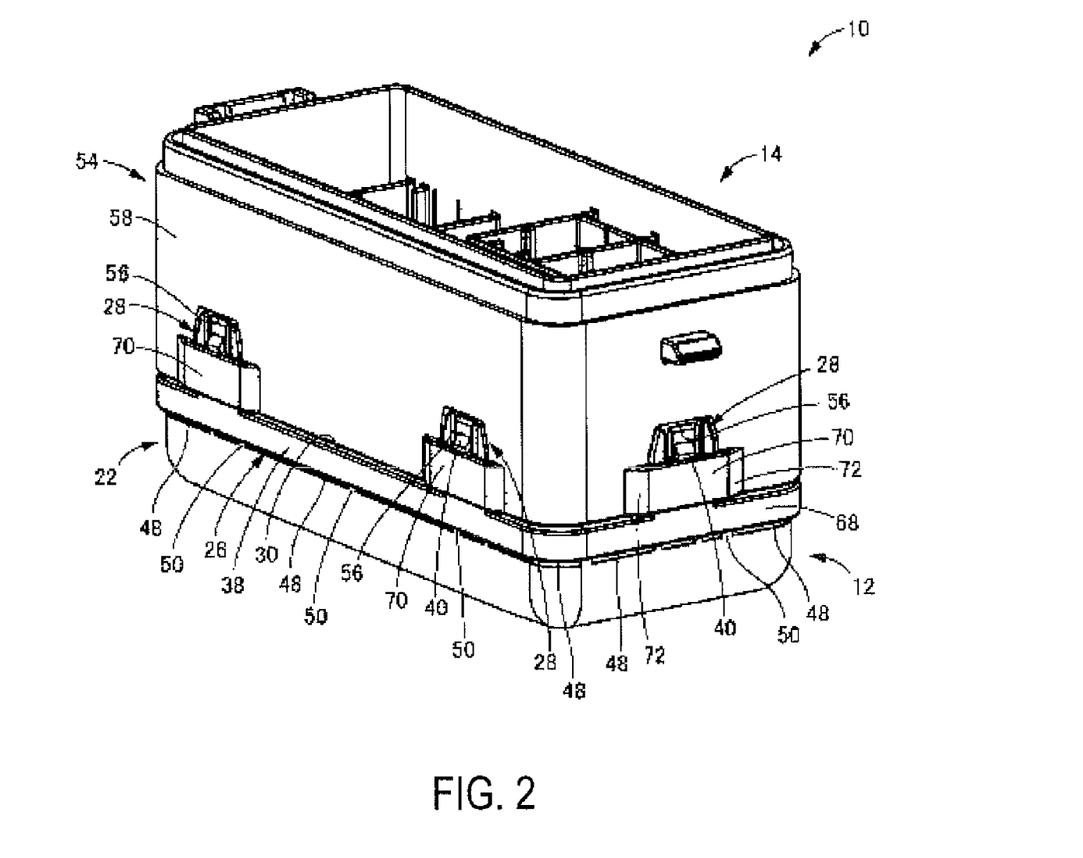
FIG. 2 is a perspective view of the electrical connection box shown in FIG. 1.

First, FIGS. 1 and 2 show an electrical connection box 10 as one embodiment. The electrical connection box 10 is formed by assembling a lower cover 12 as a first case to a main body case 14 as a second case. In the following explanation, the upper side will refer to the side of the main body case 14, and the lower side will refer to the side of the lower cover 12.

Figure 3:
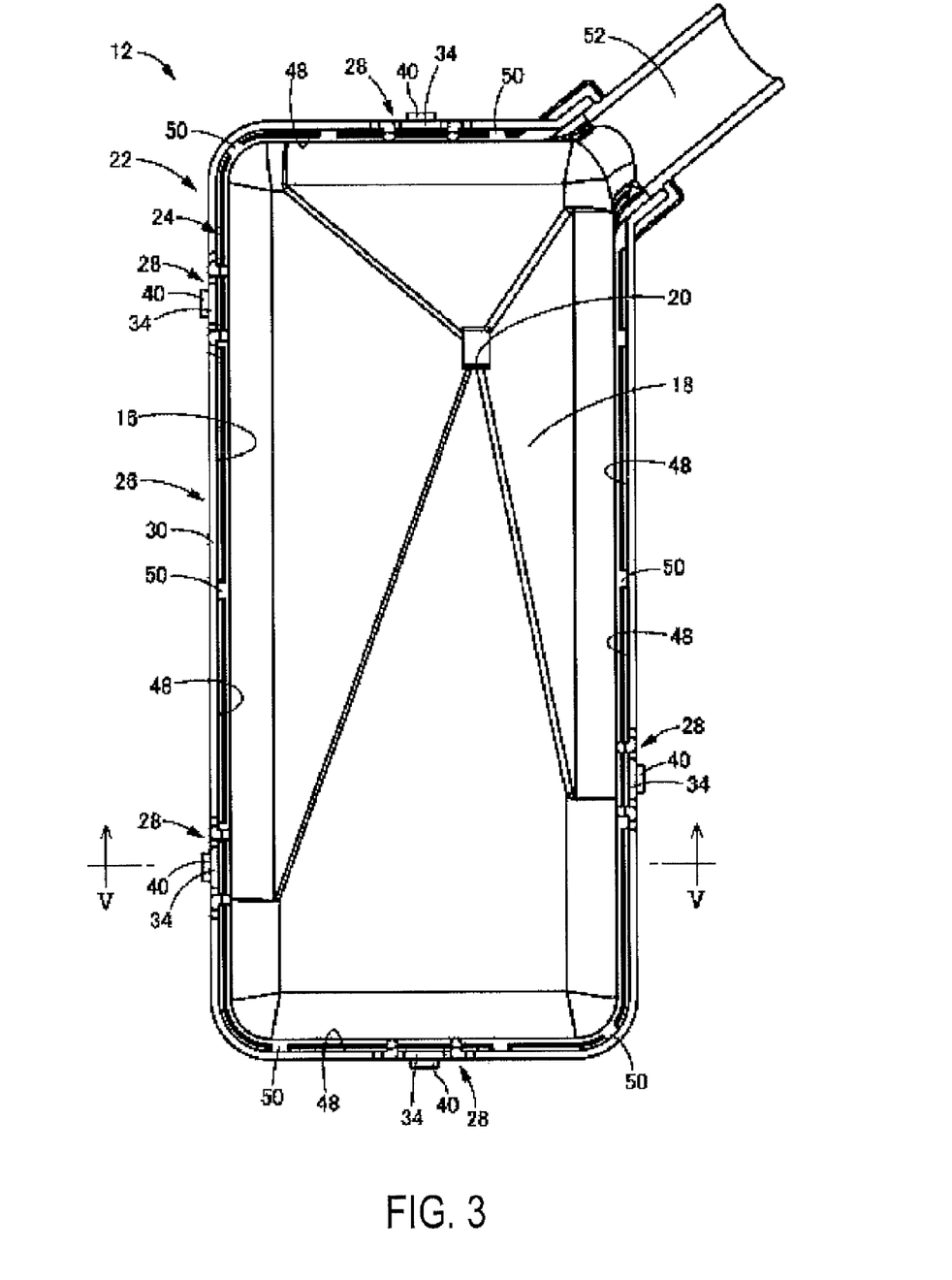
FIG. 3 is a top view of a lower cover.

The lower cover 12 is shown in FIG. 3. The lower cover 12 has an opening part 16 (also known as a first opening part) on the side of the main body case 14 and is formed, for example, as a box body with a bottom. A bottom wall 18 of the lower cover 12 is formed protruding downward so as to narrow toward one part, with a water removal hole 20 formed at a lowermost location of the bottom wall 18.

A stepped part 24 is formed, for example, stepwise along substantially an entire periphery of a peripheral wall 22 of the lower cover 12 at an end part on the side of the opening part 16, the stepped part 24 expanding toward an outer side of the lower cover 12. Also, a plurality (five in this embodiment) of insertion protrusion pieces 28 are formed on an outside peripheral wall part 26 of the peripheral wall 22 projecting to an outer side of the lower cover 12, closer to the opening part 16 than the stepped part 24. These insertion protrusion pieces 28 are all shaped in a similar manner.

Figure 4:
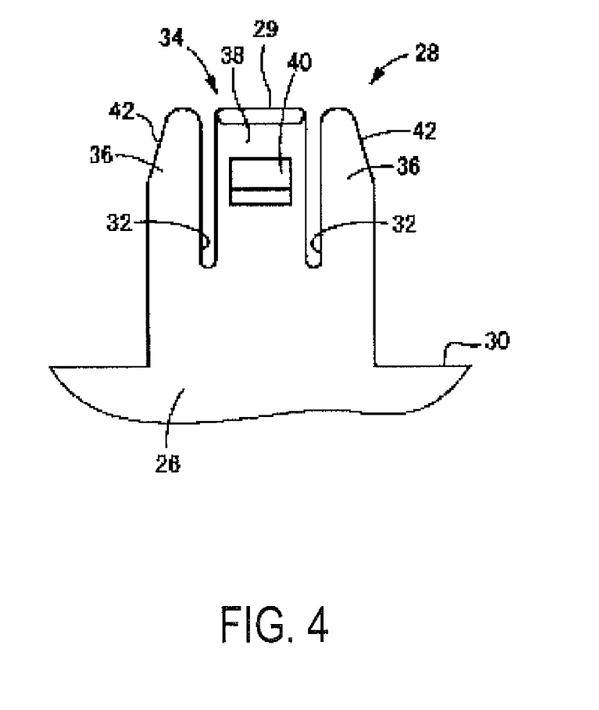
FIG. 4 is a side view of relevant portions of the lower cover.
Figure 5:
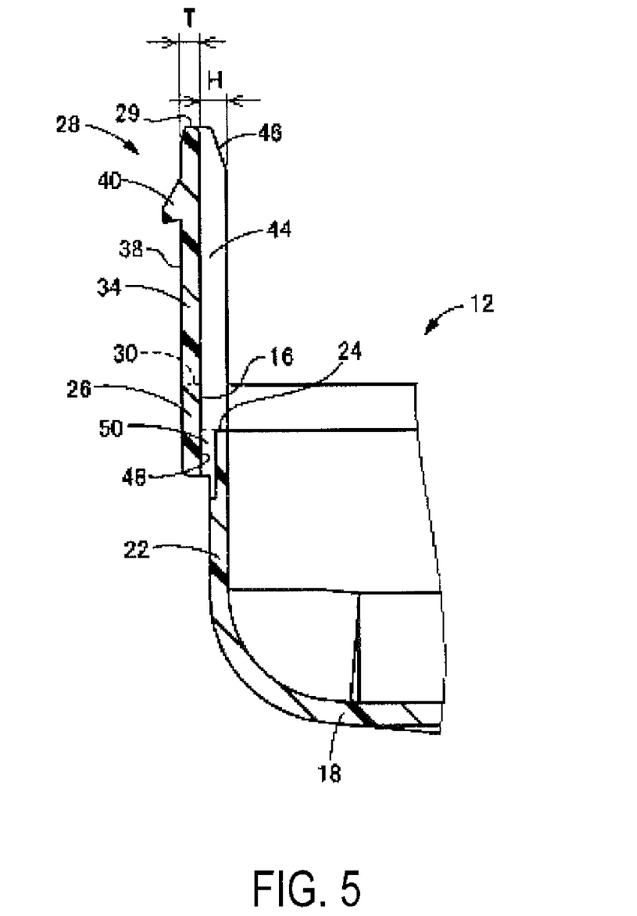
FIG. 5 is an enlarged relevant portion view of a cross-section along V-V in FIG. 3.

An insertion protrusion piece 28 is shown in FIGS. 4 and 5. The insertion protrusion piece 28 is formed as a protrusion piece which protrudes from an opening end surface 30 of the outside peripheral wall part 26 toward the main body case 14. On the insertion protrusion piece 28 is formed a pair of slits 32 and 32 extending in parallel toward the opening end surface 30 from a protruding front end edge part 29, and these slits 32 and 32 divide a front end portion of the insertion protrusion piece 28 such that a lock piece 34 forms a lock structure between the slits 32 and 32, and guides 36 and 36 are formed sandwiching the lock piece 34 on both sides. In other words, the lock piece 34 and the guides 36 and 36 of this embodiment are connected together at a base end portion so as to faun a single insertion protrusion piece 28. Of course, it would also be acceptable to form the lock piece 34 and the guides 36 and 36 as separate members which are not connected at the base end portion. Due to the insertion protrusion piece 28 protruding from the opening end surface 30, the lock piece 34 protrudes further toward the main body case 14 than the opening part 16 of the lower cover 12. Also, the protruding front end edge parts 29 of all of the lock pieces 34 provided to the lower cover 12 are evenly positioned relative to each other with respect to an insertion direction (upward in FIG. 5) into lock recesses 56 to be described below.

Each lock piece 34 is formed, for example, in the shape of a plate, with an engagement protrusion 40 being formed on an outer surface 38 of the lock piece 34. The lock piece 34 is elastically deformable toward an inner side (the right side in FIG. 5) of the lower cover 12. On the other hand, the guide parts 36 and 36 are positioned parallel and separated from the lock piece 34 by a space (the slit 32 of this embodiment) such that the guide parts 36 and 36 are formed, for example, as plates protruding at a widthwise (the left and right directions in FIG. 4) outer side of the lock piece 34. Taper parts 42 and 42 are formed on front end parts of the guide parts 36 and 36 such that the insertion protrusion piece 28 tapers to facilitate insertion into a lock recess 56 to be described below. Also, as shown in FIG. 3, the insertion protrusion pieces 28 are formed connected to the outside peripheral wall part 26 such that the lock pieces 34 and the guide parts 36 and 36 are formed without protruding outward from the outside peripheral wall part 26, and only the engagement protrusions 40 of the lock pieces 34 protrude outwardly from the outside peripheral wall part 26.

In addition, spacer parts 44 and 44 are formed on an inner surface of the guide parts 36 and 36. The spacer parts 44 and 44 protrude from the inner surface of the guide parts 36 and 36 toward the inner side (the right side in FIG. 5) of the lower cover 12, and are formed, for example, as ribs extending along entire lengths of the guide parts 36 and 36. Moreover, the spacer parts 44 and 44 extend from the stepped part 24. In addition, taper parts 46 and 46 are formed on front end parts of the spacer parts 44 and 44 such that the taper parts 46 and 46 protrude from the guide parts 36 and 36 less as they approach the front end edge part, to facilitate insertion to lock recesses 56 of the insertion protrusion pieces 28 to be described below. These spacer parts 44 and 44 are formed relative to the guide parts 36 and 36 on the side of the slits 32 and 32 such that the spacer parts 44 and 44 are formed sandwiching the lock piece 34 on both sides.

Moreover, drain holes 48 are formed in the stepped part 24. The drain holes 48 are formed penetrating the stepped part 24. As shown in FIG. 5, the drain holes 48 are formed extending approximately the entire length of the stepped part 24 other than where the beam parts 50 are formed at a plurality of locations on the periphery of the stepped part 24 to support the outside peripheral wall part 26 protruding to an outer side of the lower cover 12. Accordingly, the drain holes 48 are formed as much as possible around the entire periphery of the lower cover 12 except for the portions where the stepped part 24 is interrupted by the locations where the beam parts 50 are formed and where an electrical wire removal opening 52 is formed at a corner part of the lower cover 12.

On the other hand, as shown in FIGS. 1 and 2, the main body case 14 opens to both upper and lower sides, and is formed substantially as a longitudinal rectangular box body. The opening part on the upper side of the main body case 14 is covered by an upper cover assembled thereto.

Figure 6:
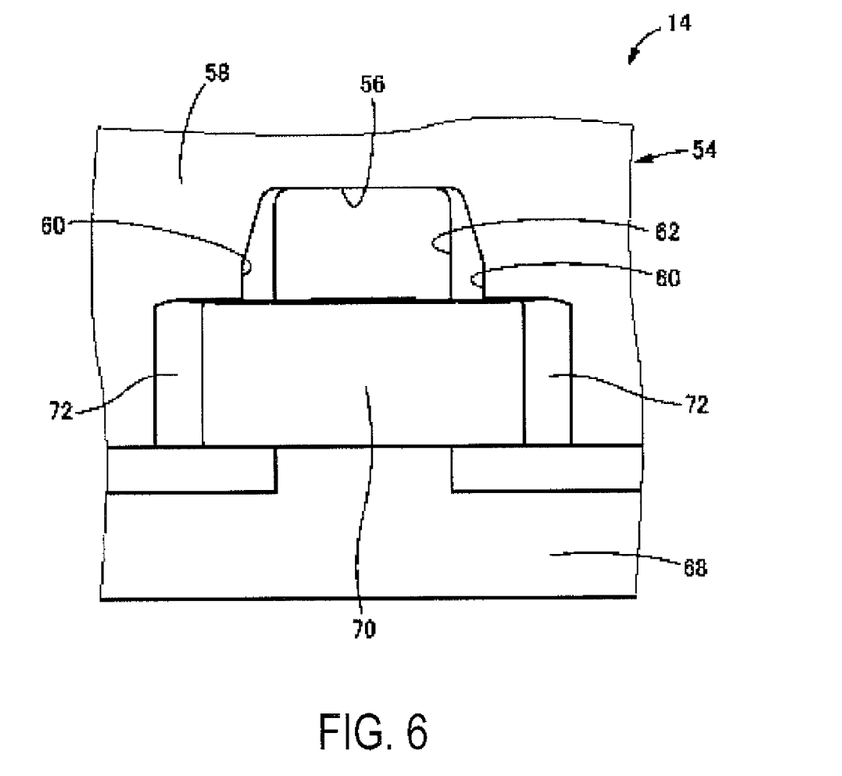
FIG. 6 is a side view of relevant portions of a main body case.
Figure 7:
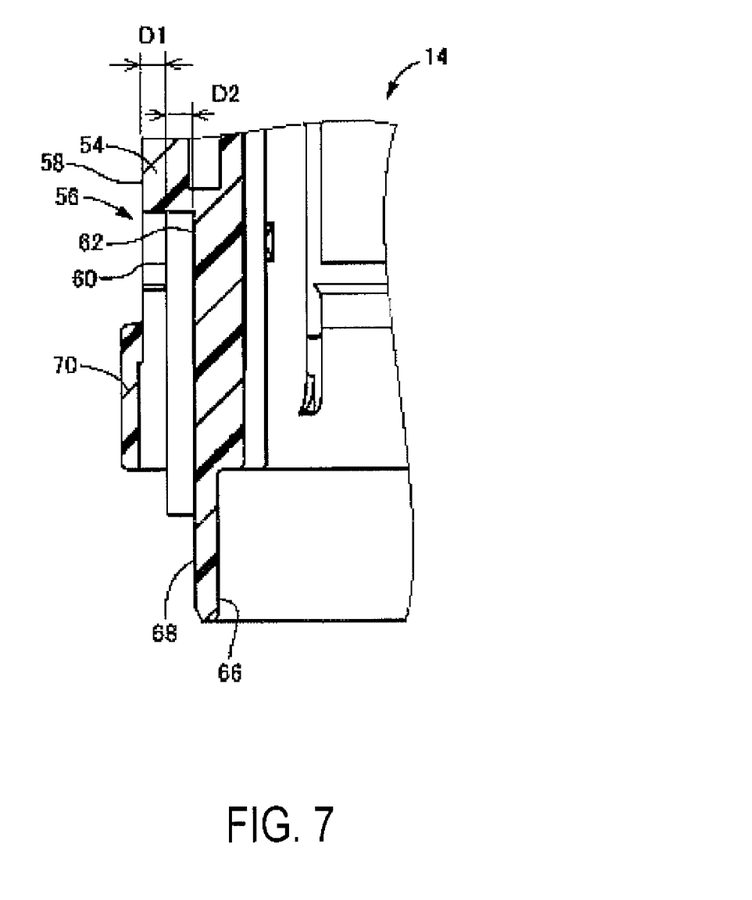
FIG. 7 is an enlarged relevant portion view of a cross-section of the main body case corresponding to FIG. 5.

On a peripheral wall 54 of the main body case 14 are formed lock recesses 56 forming the lock structure, the lock recesses 56 being formed at a plurality of locations (five locations in this embodiment) on the periphery corresponding to the lock pieces 34 of the lower cover 12. As shown in FIGS. 6 and 7, each lock recess 56 opens to an outer surface 58 of the peripheral wall 54 and is recessed toward an inner side of the main body case 14, the lock recess 56 having a concave shape extending vertically relative to the peripheral wall 54. The lock recess 56 has an uneven form in which a central portion is deep, and on both widthwise outer sides are formed first concavities 60 and 60 having a depth D1 from the outer surface 58, and a second concavity 62 having an additional depth D2 added to that of the first concavities 60 and 60 and being formed in the central portion sandwiched by the first concavities 60 and 60. Also, the depth D1 of the first concavities 60 and 60 is substantially equal to a plate thickness T (see FIG. 5) of the guide parts 36 and 36, and the additional depth D2 of the second concavity relative to the first concavities is substantially equal to a height H (see FIG. 5) of the spacer part 44.

A lower end part of the peripheral wall 54 has an uneven form recessed toward the inner side of the main body case 14, and an opening part outer surface 68, which is the outer surface of an opening part 66 of the lower side (also known as a second opening part), is on a same plane as a bottom surface of the second concavity 62 of the lock recess 56. Accordingly, a lower end part of each lock recess 56 opens below the peripheral wall 54 at the side of the lower cover 12. In addition, the lower end part of the lock recess 56 is bridged and covered by an engagement part 70 formed protruding from the outer surface 58 of the peripheral wall 54. Each engagement part 70 has, for example, a substantially rectangular plate form and is formed straddling the lock recess 56. A connection part 72 of the engagement part 70 connecting with the outer surface 58 is formed, for example, tapered so as to minimize the unevenness of the peripheral wall 58 and reduce the catching of electrical wires and the like. Accordingly, the lower end part of the lock recess 56 has a through-hole formed by an inner wall of the lock recess 56 and the engagement part 70. Also, a portion of the lock recess 56 above the engagement part 70 opens above the outer surface 58 of the peripheral wall 54.

Figure 8:
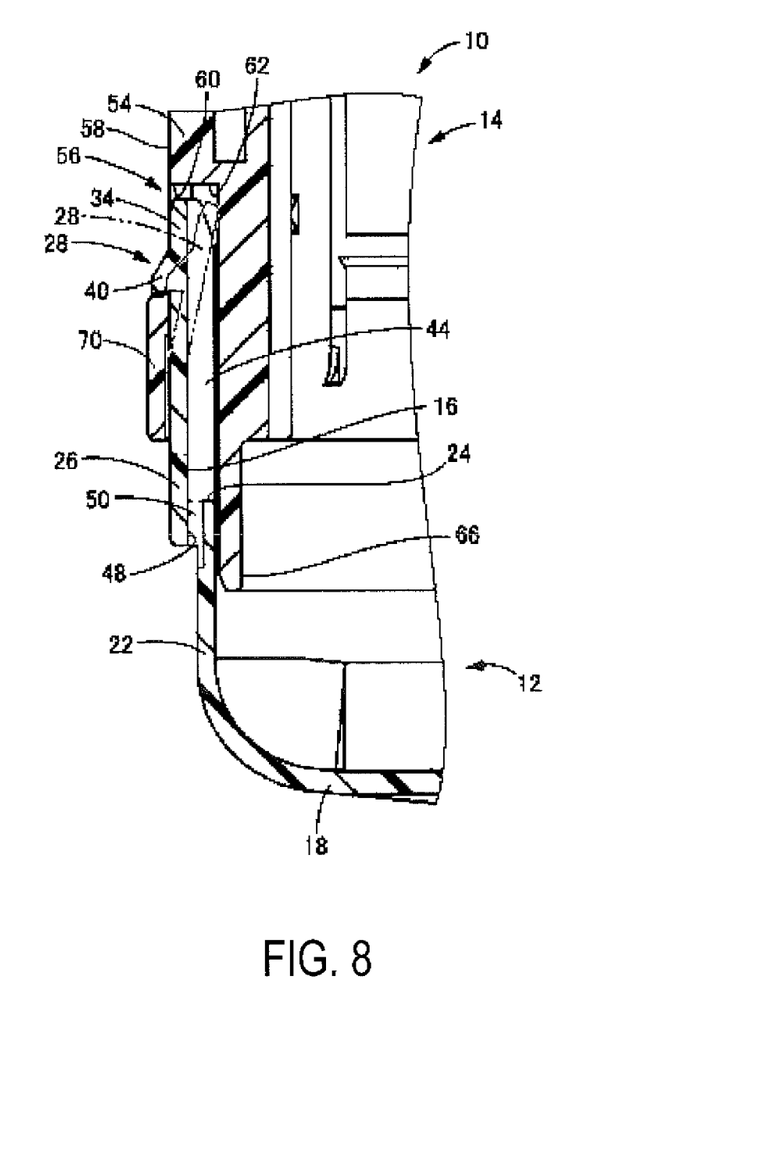
FIG. 8 is an enlarged relevant portion view of a cross-section corresponding to FIG. 5 showing an assembled state of the main body case and the lower cover.

When assembling the lower cover 12 to this main body case 14, each insertion protrusion piece 28 of the lower cover 12 is inserted into a corresponding lock recess 56 of the main case body 14 from between the lock recess 56 and the engagement part 70. Accordingly, as shown in FIGS. 2 and 8, the lock piece 34, the guide parts 36 and 36, and the spacer parts 44 and 44 are inserted to and held by the lock recess 56, and the engagement protrusion 40 of the lock piece 34 rides over the engagement part 70 and is latched on an upper side of the engagement part 70. Accordingly, the main body case 14 and the lower cover 12 are assembled to each other. With the main body case 14 and the lower cover 12 in the assembled state, the opening part 66 of the main body case 14 fits over the opening part 16 of the lower cover 12.

With the electrical connection box 10 formed according to this embodiment, the lock pieces 34 of the lower cover 12 protrude further toward the main body case 14 than the opening part 16 of the lower cover 12. Accordingly, prior to mating the opening part 66 of the main body case 14 with the opening part 16 of the lower cover 12, the lock pieces 34 are inserted between the lock recesses 56 and the engagement parts 70 of the main case body 14 such that the opening parts 16 and 66 of each case can be aligned and easily mated. In particular, with the present embodiment, the protruding front end edge parts 29 of all of the lock pieces 34 are evenly positioned relative to each other with respect to an insertion direction into the lock recesses 56 such that all of the lock pieces 34 can be inserted into each respective lock recess 56 at the same time in order to reliably align the lower cover 12 and the main body case 14 in the circumferential direction.

In addition, the guide parts 36 and 36 provided on both sides of each lock piece 34 are inserted into the lock recess 56 together with the lock piece 34 such that friction between the lock piece 34 and the lock recess 56 can be avoided, and insertion of the lock piece 34 can be carried out smoothly. Moreover, rattling of the lock piece 34 inside the lock recess 56 can be suppressed and insertion can be reliably carried out because the guide parts 36 and 36 are inserted into the first concavities 60 and 60 of the lock recess 56 and the spacer parts 44 and 44 are inserted into the second concavity 62.

Furthermore, the lock pieces 34 are formed protruding from the opening end surface 30 of the lower cover 12 so as to not protrude outward from the lower cover 12. Also, the lock pieces 34 are inserted into the lock recesses 56 so as to be positioned on substantially the same plane as the peripheral surface 58 of the main body case 14. Accordingly, it is possible to reduce the unevenness on the surface of the electrical connection box 10, reduce the likelihood of electrical wires and such catching on the surface, and improve the aesthetic appearance of the electrical connection box 10.

Also, when releasing the engagement between each lock piece 34 and each engagement part 70 as shown in FIG. 8, an upper end part of the lock piece 34 exposed on the peripheral surface 58 above the engagement part 70 is pushed and deformed inside the lock recess 56 toward the inner side (the right side in FIG. 8) of the lower cover 12. Accordingly, the engagement between the engagement protrusion 40 of the lock piece 34 and the engagement part 70 can be released. In this manner, according to the present embodiment, it is possible to release the lock by pushing the lock piece 34 to the inner side of the lower cover 12, and the lock can be easily released without the need for a special tool or the like. In particular, the guide parts 36 and 36 are interposed between each lock piece 34 and each lock recess 56 such that friction of the lock piece 34 with the lock recess 56 can be avoided and the lock piece 34 can be more easily pushed. Furthermore, the spacer parts 44 and 44 are inserted into each lock recess 56 such that a clearance in the direction of pushing the lock piece 34 (to the right in FIG. 8) can be reliably maintained inside the lock recess 56.

In addition, the lock pieces 34 are formed in the peripheral wall 22 of the lower cover 12 on the outside peripheral wall part 26 which projects outward over the stepped part 24, and the drain holes 48 penetrate the stepped part 24. Accordingly, water which penetrates between the main body case 14 and the lower cover 12 can be evacuated to outside of the electrical connection box 10 via the drain holes 48. In other words, by forming the stepped part 24, the bending area of the lock piece 34 can be maintained, and the waterproofing properties are improved by suitably using the stepped part 24 and forming the drain holes 48. In particular, with the present embodiment, the drain holes 48 are formed along substantially the entire periphery of the lower cover 12 such that improved waterproofing properties can be ensured.

Although embodiments of the present invention were described above, the present invention is not limited to that specific disclosure. For example, the first case and the second case assembled beneath it are not limited to the lower cover and the main body case, but the present invention could be applied such that the first case is an upper case assembled above a main body case, and the second case is the main body case assembled below the upper case.

In addition, the lock pieces are not limited to protruding from the opening end surface of the peripheral wall of the first case, and it would also be suitable for the lock pieces to protrude over the opening part from the outer surface of the peripheral wall. In addition, the guide parts and the spacer parts are not entirely necessary. Also, the stepped part is not entirely necessary.

What is claimed is:

1. An electrical connection box assembled by a lock structure, the electrical connection box comprising:
    a first case having a first opening part;
    a second case having a second opening part mated to the first opening part of the first case;
    a plurality of lock pieces provided to a peripheral wall of the first case, the lock pieces protruding toward the second case further than the first opening part of the first case, the lock pieces each forming the lock structure and being elastically deformable toward an inner side of the first case;
    an engagement protrusion provided to an outer surface of each lock piece;
    a plurality of lock recesses provided to a peripheral wall of the second case, the lock recesses opening to an outer surface of the second case and being recessed toward an inner side of the second case, the lock recesses each forming the lock structure and having an end part on a first case side of the second case opening toward the first case; and
    an engagement part provided at each lock recess on the end part of the first case side, the engagement part bridging the lock recess such that an opening of the lock recess toward the outer surface is partially covered by the engagement part,
    the lock pieces of the first case being disposed inside the lock recesses between the lock recesses and the engagement parts of the second case, the engagement protrusions of the lock pieces engaging the engagement parts such that the first case and the second case are assembled to each other,
    engagement between the engagement protrusions and the engagement parts being released by deformation of the lock pieces inside the lock recesses toward an inner side of the first case.

2. The electrical connection box recited in claim 1, wherein each lock piece of the first case protrudes from an opening end surface of the peripheral wall of the first case.

3. The electrical connection box recited in claim 1, further comprising
    a guide part formed protruding on each lock piece of the first case on both widthwise sides of the lock piece, the guide part being disposed inside the lock recess together with the lock piece.

4. The electrical box recited in claim 3, further comprising
    a spacer part formed protruding on each lock piece of the first case on both widthwise sides of the lock piece, the spacer part protruding toward the inner side of the first case and being disposed inside the lock recess together with the lock piece and the guide part.

5. The electrical box recited in claim 4, wherein
    the spacer part is disposed between the guide part and the lock piece with respect to a widthwise direction of the lock piece.

6. The electrical box recited in claim 4, wherein
each lock recess has a first concavity with a first depth and a second concavity with a second depth, the second depth being greater than the first depth,
the guide part being disposed in the first concavity and the spacer part being disposed in the second concavity.

7. The electrical box recited in claim 4, wherein
each lock recess has a first concavity with a first depth measured from the outer surface of the second case and a second concavity with a second depth measured from the outer surface of the second case, the second depth being greater than the first depth,
the guide part having a thickness corresponding to the first depth of the first concavity and the spacer part having a height corresponding to a difference between the first depth of the first concavity and the second depth of the second concavity.

8. The electrical box recited in claim 1, further comprising
a spacer part formed protruding on each lock piece of the first case on both widthwise sides of the lock piece, the spacer part protruding toward the inner side of the first case and being disposed inside the lock recess together with the lock piece.

9. The electrical box recited in claim 8, wherein
the spacer part is disposed so as to form a space between a central portion of the lock piece and a central portion of a respective lock recess.

10. The electrical box recited in claim 1, wherein
protruding front end edge parts of all of the lock pieces provided to the first case are evenly positioned relative to each other with respect to an insertion direction into the lock recesses.

11. The electrical box recited in claim 1, further comprising
a stepped part formed in the peripheral wall of the first case at the first opening part of the first case, the stepped part expanding to an outer side of the first case, the lock pieces projecting further than the stepped part with respect to an insertion direction into the lock recesses; and
a drain hole penetrating the stepped part.

12. The electrical connection box recited in claim 1, wherein
each lock piece has a first locked position and a second released position, a respective engagement protrusion engaging a respective engagement part with the lock piece in the first locked position, and the respective engagement protrusion being spaced from the respective engagement part with the lock piece in the second released position.

13. The electrical connection box recited in claim 12, wherein
each lock piece has a free end, the free end being closer to the peripheral wall of the second case when the lock piece is in the first locked position than when the lock piece is in the second released position.

* * * * *